United States Patent [19]

Terasawa et al.

[11] 4,223,328

[45] Sep. 16, 1980

[54] FIELD CONTROLLED THYRISTOR WITH DUAL RESISTIVITY FIELD LAYER

[75] Inventors: Yoshio Terasawa; Kenji Miyata, both of Katsuta; Masayoshi Naito, Hitachi; Takuzo Ogawa, Hitachi; Masahiro Okamura, Hitachi, all of Japan

[73] Assignee: Hitachi, Ltd., Japan

[21] Appl. No.: 911,311

[22] Filed: Jun. 1, 1978

[30] Foreign Application Priority Data

Jun. 8, 1977 [JP] Japan .................................. 52-66648

[51] Int. Cl.² .......................................... H01L 29/80
[52] U.S. Cl. ........................................ 357/22; 357/20; 357/38; 357/55; 357/59; 357/64
[58] Field of Search ................. 357/38, 22, 20, 21, 357/55, 64, 59

[56] References Cited

U.S. PATENT DOCUMENTS

| | | | |
|---|---|---|---|
| 3,553,536 | 1/1971 | Neilson | 357/64 |
| 4,037,245 | 7/1977 | Ferro | 357/38 |
| 4,060,821 | 11/1977 | Houston et al. | 357/38 |
| 4,132,996 | 1/1979 | Baliga | 357/38 |
| 4,146,906 | 3/1979 | Miyata et al. | 357/59 |

Primary Examiner—Joseph E. Clawson, Jr.
Attorney, Agent, or Firm—Craig & Antonelli

[57] ABSTRACT

A field controlled thyristor is disclosed which comprises a first emitter region exposed to one main surface of a semiconductor substrate and having a first conductivity type, a second emitter region exposed to the other main surface of the substrate and having a second conductivity type, a base region connecting the first and the second emitter region, and a gate region provided in the base region. The gate region consists of a slab-like first portion disposed parallel to both the emitter and a second portion connecting the first slab-like portion with one of the main surfaces of the semiconductor substrate. The impurity concentration of the base region is higher in the portion of the base region nearer to the emitter region having the same conductivity type as that of the base region than in the portion of the base region nearer to the emitter region having the opposite conductivity type to that of the base region. The field controlled thyristor has a high forward blocking voltage gain (anode-cathode voltage/gate bias voltage), a large current rating, and a high switching power capability and its switching time is very short.

11 Claims, 14 Drawing Figures

FIELD CONTROLLED THYRISTOR WITH DUAL RESISTIVITY FIELD LAYER

BACKGROUND OF THE INVENTION

1. Field of the Invention

This invention relates to a semiconductor switching element and more particularly to a field controlled thyristor.

2. Description of the Prior Art

Up to now, various field controlled thyristors have been proposed which comprise a first emitter region having a first conductivity type, exposed to one main surface of a semiconductor substrate; a second emitter region having a second conductivity type, exposed to the other main surface of the semiconductor substrate; a base region having the second conductivity type and connecting both the emitter regions; and a gate region having the first conductivity type, disposed in the base region, wherein the main current flowing between both the emitter regions is controlled by the depletion layer formed in the base region due to the gate bias voltage applied to the gate region with respect to the emitter region having the second conductivity type.

FIG. 1 shows a conventional field controlled thyristor in which the gate region is exposed to the main surface of the semiconductor substrate and provided extending along a cathode region. This type of semiconductor device is disclosed in, for example, D.E. Houston et al, "A FIELD TERMINATED DIODE", IEEE Trans Electron Devices, vol. ED-23, p905 (1976) or Japanese Patent Laid-Open specification No. 50176/77. As shown in FIG. 1, a semiconductor substrate 1 comprises a P+ anode region 11 exposed to the first main surface 101 of the substrate 1; an n base region 12 adjacent to the P+ anode 11 and exposed to the second main surface 102 of the substrate 1; n+ cathode regions 13 formed in the n base region 12, adjacent to the second main surface 102; and p+ gate regions 14 formed in the n base region 12, adjacent to the second main surface and extending along the n+ cathode regions 13. An anode electrode 15, cathode electrodes 16 and gate electrodes 17 are formed respectively on those portions of the p+ anode region, n+ cathode regions and p+ gate regions which are exposed in the second main surface 102 of the substrate 1. An SiO$_2$ film 5 is formed on the remaining exposed portions of the second main surface 102. In this semiconductor device, the n+ cathode regions 13 and the p+ gate regions 14 are exposed to the second main surface 102 of the substrate 1, with the n base region 12 interposed therebetween. This configuration makes the space between the adjacent portions of the p+ gate regions 14 large so that a high gate bias voltage is needed to block the main current. As a result, the forward blocking voltage gain, defined as the voltage between anode and cathode divided by the gate bias voltage required to block the anode-cathode voltage, becomes small and the semiconductor device is therefore unsuitable for switching application. Even if the space between the p+ regions 14 is narrowed so that the forward blocking voltage gain can be improved, the current rating of the device is decreased since the width of each of the n+ cathode regions 13 must be accordingly decreased. In some extreme cases, there arises a danger of decreasing the switching power capability or thermally destroying the device since the respective narrow widths of the n+ cathode regions 13 and the cathode electrodes 16 cause the increase in the current density.

SUMMARY OF THE INVENTION

The object of this invention is to provide a field controlled thyristor having a high switching power capability with short switching time.

The first feature of this invention is that the impurity concentration in the base region of the field controlled thyristor is higher in the portion of the base region nearer to the emitter region having the same conductivity as that of the base region, than in the portion of the base region nearer to the emitter region having the conductivity type opposite to that of the base region.

The second feature of this invention is the above first feature plus the structure in which the gate region is buried in the base region, extending parallel to the main surfaces of the semiconductor substrate, with the portions of the gate region overlapping the projection of the emitter region having the same conductivity type as that of the base region onto the main surface opposite to the emitter region.

The third feature of this invention is the first and second features described above plus the structure in which the buried portions of the gate region lie in the boundary portions between the high impurity concentration portions and the low impurity concentration portions in the base region.

DESCRIPTION OF THE PREFERRED EMBODIEMNTS

Figure 1:
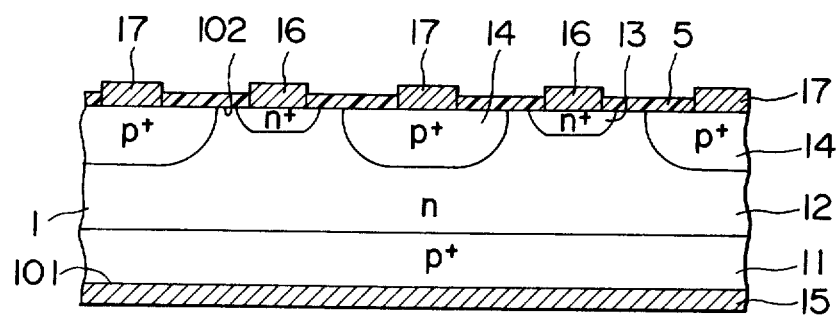
FIG. 1 shows in cross section a conventional field controlled thyristor.
Figure 2A:
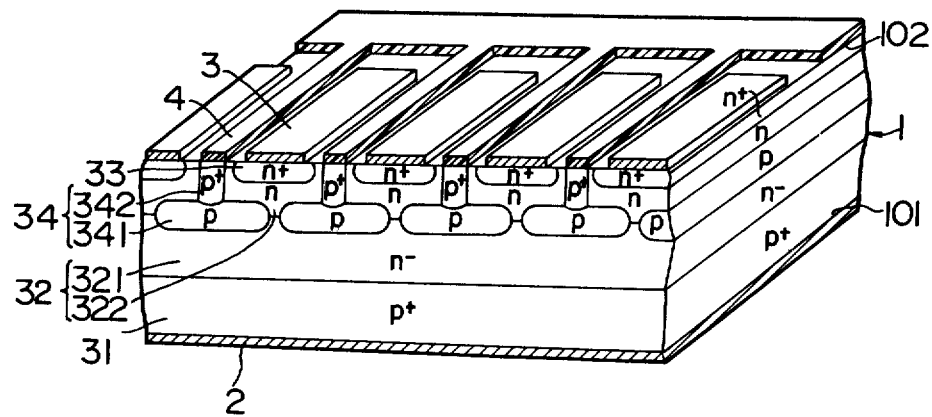
FIG. 2A shows in perspective view and in cross section a portion of a device as an embodiment of this invention.

In FIG. 2A, a semiconductor substrate 1 comprises a continuously formed, p+ anode region 31 adjoining the first main surface 101 of the substrate 1; an n base region 32 formed adjoining to the anode region 31, with its discrete portions exposed to the second surface 102 of the substrate 1; n+ cathode regions 33 formed adjoining the n base region 32, exposed to the second main surface 102; and p gate regions 34 formed adjoining the n base region 32, exposed to the second main surface 102 along the exposed portions of the n+ cathode regions 33.

Each of the gate regions 34 consists of a first slab-like portion 341 buried in the base region 32 parallel to the main surfaces and a second portion 342 extending to and exposed in the second main surface 102 and also having a higher impurity concentration than the first portion 341. The first slab-like portions 341 has gaps under the n+ cathode regions 33 and the gap regions are called channels. The n base region 32 consists of a first region 321 extending from the p+ anode region 31 to the channels and second regions 322 extending from the channels to the second main surface 102 and the cathode regions 33. The second region 322 has an impurity concentration higher than the first region 321.

Figure 2B:
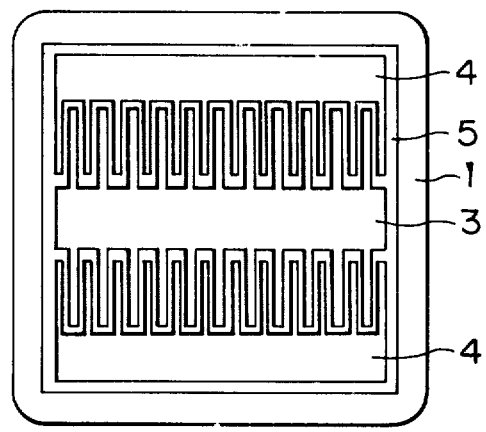
FIG. 2B is a plan of the device shown in FIG. 2A.
Figure 2C:
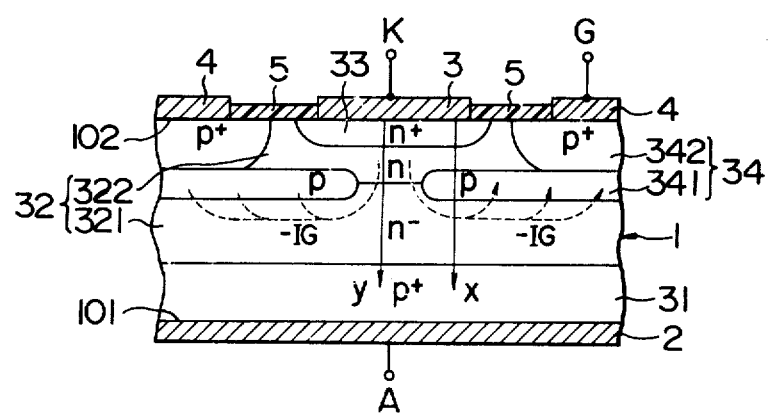
FIG. 2C shows on an enlarged scale a principal portion of the device shown in FIG. 2A.

An anode electrode 2, a cathode electrode 3 and a gate electrode 4 are formed respectively on the exposed surfaces of the anode region 31, the cathode regions 33 and the second portions 342 of the gate regions 34. As shown in plan in FIG. 2B, the pattern of the cathode and gate electrodes 3 and 4 on the second main surface 102 of the field controlled thyristor (hereinafter referred to as FCT) as an embodiment of this invention is of interdigitated geometry. In FIGS. 2B and 2C, reference numeral 5 indicates a surface passivation film of $SiO_2$ which is omitted in FIG. 2A.

Figure 3:
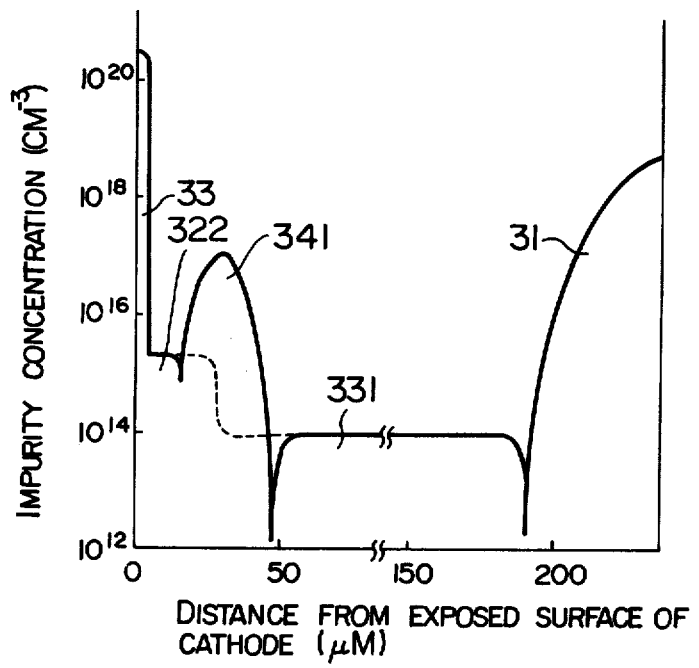
FIG. 3 shows the profile of the impurity concentration in the field controlled thyristor shown in FIG. 2.

The method of fabricating such an FCT as described above is roughly as follows. A p+ anode region 31 is first formed by diffusing boron atoms into an n-type silicon wafer having a resistivity of about 50 Ω-cm and a thickness of about 220 μm from one main surface thereof up to a depth of about 50 μm. Again, boron atoms are selectively diffused into the Si wafer from its second main surface up to a depth of about 15 μm. The selectively diffused regions are to be used as the first portions 341 of the p+ gate regions 34. Then, an n-type semiconductor layer having a thickness of about 20 μm and an impurity concentration of about $1 \times 10^{15}$ cm$^{-3}$ is epitaxially formed on the entire part of the second main surface. Thereafter, the wafer is subjected to heating treatment at temperatures higher than in the process of epitaxial growth so as to prevent the adjacent selectively diffused regions from being bridged due to auto-doping. The second portions 342 of the p gate regions is formed by selectively diffusing boron atoms from the surface of the n epitaxial layer in the positions corresponding to the centers of the first portions 341 of the p+ gate regions 34. Due to the heat treatment for diffusing the second portions 342, the thickness of the first portions 341 which was about 15 μm, is now increased to about 40 μm and the channels have a width of about 5 μm. N+ cathode regions 33 are formed by selectively diffusing phosphorus atoms in the surface of the n layer, along the exposed second portions of the p gate regions, up to a depth of about 3 μm. Finally, an anode electrode 2, a cathode electrode 3 and a gate electrode 4 are formed respectively on the exposed surfaces of the p+ anode region 31, the n+ cathode regions 33 and the second portions 342 of the p gate regions 34. The changes in the impurity concentrations in the FCT as an embodiment of this invention in the x- and y-directions shown in FIG. 2C are respectively represented by solid and dashed curves in FIG. 3. The special feature to be noted from FIG. 3 is that the impurity concentration in the first portion 341 of the p gate region gradually increases in an interval as the distance from the cathode region 33 increases and that the maximum impurity concentration is below $1 \times 10^{18}$ cm$^{-3}$. The effects produced by the structural feature will be apparent from the following description.

It should be noted that the method of fabricating a FCT according to this invention and the dimensions of the respective parts of the FCT and the impurity concentrations therein are by no means limited to those described above. For example, a p+-type wafer may be used as a starting material and a n-type semiconductor layer may be epitaxially grown on the wafer, the n-type semiconductor layer corresponding to the n-type wafer of Si used in the above embodiment.

Now, description will be made of the main effects enjoyed by the FCT as an embodiment of this invention and the operation of the FCT, from turn-on to gate turn-off via on-state. The embodiment of this invention has two main effects: (1) the turn-on and turn-off times are both short and (2) the switching power consumed in turn-on action is small. These effects result from the operation described as follows.

In order to turn on the FCT described above as an embodiment of this invention, it is necessary to open the gate circuit used to turn off the FCT and to apply a voltage between the anode electrode 2 and the cathode electrode 3, with the anode and cathode electrodes 2 and 3 kept positive and negative, respectively. As soon as the voltage has been applied, the foward current $i_D$ of a P+n−nn+ diode consisting of the anode region 31, the first portion 321 of the base region 32, the second portion 322 of the base region 32 and the cathode region 33, flows through the channels. For this purpose, it is preferable to prevent the channels from being pinched off by the potential barriers due to the diffusion potential between the first portion 341 of the gate region 34 and the first portion 321 of the base region 32 and between the first portion 341 and the second portion 322 of the base region. The pinch-off can be prevented by suitably controlling the impurity concentrations in the respective regions and the channel width of the FCT. In this embodiment, such an undesirable pinch-off never takes place.

Figure 4:
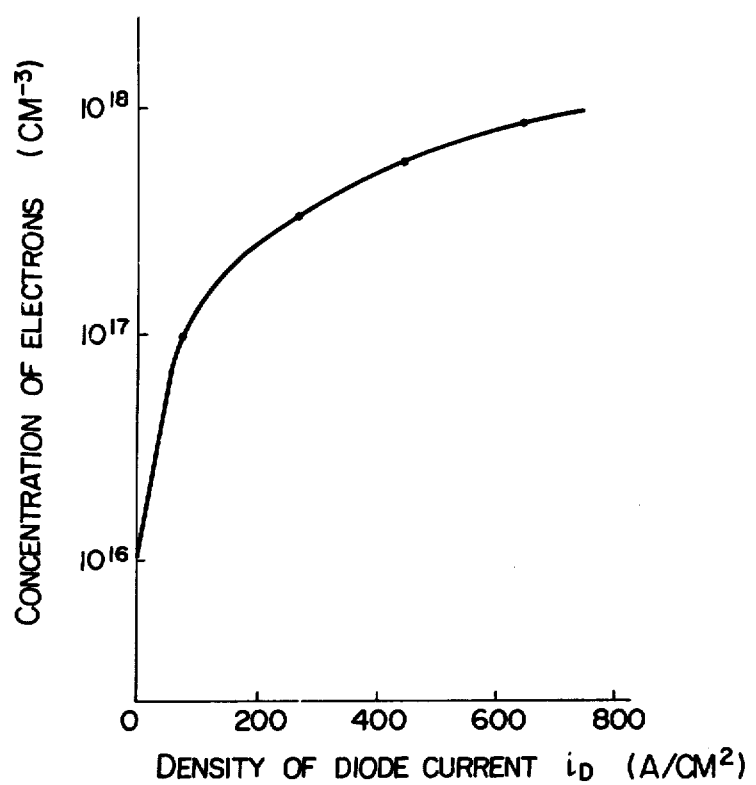
FIG. 4 shows the relationship between the diode current and the concentration of electrodes injected from the n+ cathode region, when the field controlled thyristor shown in FIG. 2 becomes on-state.

FIG. 4 shows the relationship between the density of the above mentioned current $i_D$ and the concentration of electrons injected from the cathode region 33 into the base region 32. It is seen from FIG. 4 that electrons having a concentration higher than $1 \times 10^{16}$ cm$^{-3}$ are injected for $i_D \simeq 10$ A/cm$^2$. Carriers having positive charge (i.e., holes) almost equal in number to the electrons are injected from the anode region 31. Those injected carriers flow through diffusion and drift into the respective regions or portions of an n+npn−p+ thyristor consisting of the cathode region 33, the second portion 322 of the base region 32, the first portion 341 of the gate region 34, the first portion 321 of the base region 32 and the anode region 31, the n+npn−p+ thyristor being adjacent to the n+nn−p+ diode described above. Consequently, the n+npn−p+ thyristor turns on very rapidly to establish a highly conductive state. The current density $i_D \simeq 10$ A/cm$^2$ proves to be rather small if compared with the average current density 100–200 A/cm$^2$ of an ordinary diode. On the other hand, the electron concentration of $1 \times 10^{16}$ cm$^{-3}$ is rather large since the carrier concentration required for turn-on, off of an ordinary pnpn thyristor, is about $1 \times 10^{14}$ cm$-3$. Thus, the FCT according to this invention can be said to have an effect that the FCT turns on easily and that the turn-on action is completed in a very short time. The turn-on time typical of this invention was 1.43 μsec.

In the n base region 32 of the FCT according to this invention, the impurity concentration in the second portion 322 is higher than in the first portion 321. This structure brings about the following effects. An electric field directed from cathode to anode is generated in the part of the first portion 341 of the gate region in which the impurity concentration increases with the distance from the cathode region. The electric field repels the electrons flowing from the cathode region 33 into the first portion 341 of the gate region via the second portion 322 of the base region. Accordingly, if the impurity concentrations in the first and second portions 321 and 322 of the base region are of the same order, the turn-on time becomes long so that the loss of switching power for turn-on is considerable. According to this invention, the electric field is relaxed by making the impurity concentration is the second portion 322 of the n base region higher than that in the first portion 321 of the n base region, whereby the loss of switching power for turn-on can be decreased.

In the conducting state of the FCT, current flows through the $n^+nn^-p^+$ diode region and the $n^+npn^-p^+$ thyristor region and the $n^+npn^{31}$ $p^+$ thyristor region is larger than the $n^+nn^-p^+$ diode region.

Figure 5:
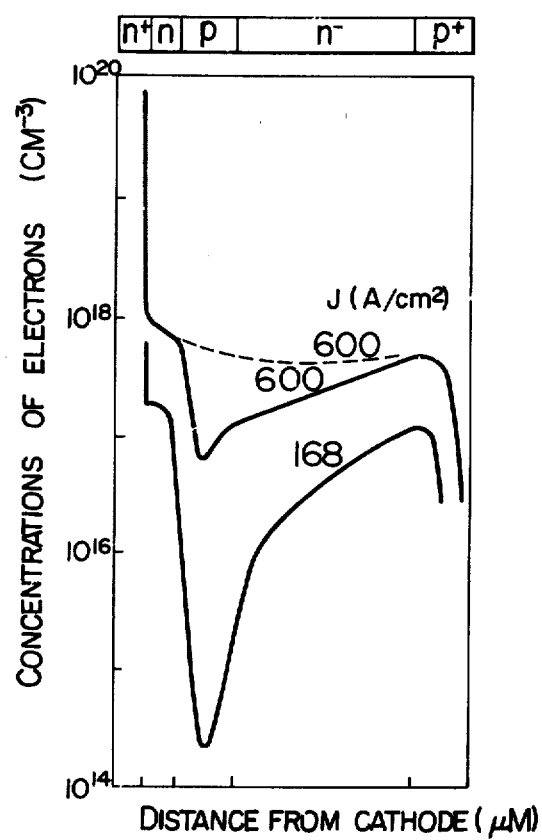
FIG. 5 shows the profile of electron concentration in the field controlled thyristor shown in FIG. 2, when it is in on-state.

FIG. 5 shows the profiles of the electron concentrations in the thyristor region in the conducting state with current densities of 600 A/cm$^2$ and 168 A/cm$^2$. In FIG. 5, the dashed curve represents for comparison the electron concentration profile of a conventional type thyristor fabricated by diffusion process alone, in the conducting state with a current density of 600 A/cm$^2$. The feature of the FCT according to this invention is that the electron concentration has a minimum value within the first portion 341 of the gate region, as seen in FIG. 5. In order that the $n^+npn^-p^+$ structure may perform a thyristor action effectively, the impurity concentration in the first portion 341 of the gate region is preferably lower than $1 \times 10^{18}$ cm$^{-3}$.

In order to turn off the FCT according to this invention is, a gate bias voltage must be applied between the cathode and gate electrodes 3 and 4, with the cathode and gate electrodes 3 and 4 kept positive and negative, respectively. Just after the application of the gate bias voltage, therefore, the holes which were flowing from the anode region 31 to the cathode region 33, now flow into the gate region. The electrons that were flowing from the cathode region 33 to the anode region 31, now flow rapidly due to diffusion into the part of the first portion 341 of the gate region where the electron density is minimum. Moreover, since the impurity concentration is relatively high in the gate region, the life times of the carriers are as short as 0.5– 1 μsec. so that electrons are swiftly recombined with holes and annihilate in the gate region. Thereafter, the depletion region due to the gate bias voltage expands mainly into the base region 32 around the gate region 34 and pinches off the channels to interrupt the cathode current through the FCT. Then, the FCT is cut off since either the residual carriers in the base region flows into the gate region due to diffusion, or they annihilate due to the recombination in the base region.

An FCT as an embodiment of this invention could be turned off by applying a gate bias voltage of $-15$V when the anode current was 20 A. The typical turn-off time was about 10 μsec. The voltage blocked between the anode and cathode electrodes 3 and 2 was 800 V. Thus, the FCT has an excellent turn-off characteristic.

Another embodiment of this invention will be described.

Figure 6:
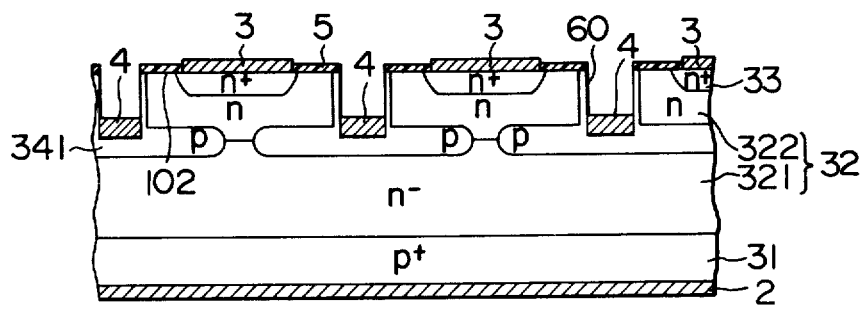
FIGS. 6 to 10 respectively show other embodiments of this invention and the associated characteristics.

FIG. 6 shows in cross section an FCT as another embodiment of this invention. The FCT shown in FIG. 6 is featured in that the gate electrode 4 is provided at the bottoms of the grooves 60 which are cut from the second main surface 102 of the semiconductor substrate up to the first portions 341 of the gate regions. Except this feature, the second embodiment in FIG. 6 has the same structure as the first embodiment in FIG. 2. Both the embodiments operate in the same manner. A method of fabricating the second embodiment of this invention will be simply described below.

An n-type silicon substrate having main surfaces is used as a starting material. For the formation of the p$^+$ anode region 31, the first portions 341 of the p gate regions, the second regions 322 of the n base region and the cathode regions 33, the same process as used in the fabrication of the FCT as the first embodiment of this invention in FIG. 2 can be used. Then, the entire surface of the silicon substrate is covered by oxide film, nitride film or the like. The coating film is partially removed on the portions of the substrate where the grooves 60 are cut by the well-known photoetching technique. The thus treated Si substrate is immersed in a chemical etching solution to cut grooves 60. If the main surfaces have a special plane (110), chemical etching solution which is a mixture of potassium hydroxide, isopropyl-alcohol and water can be used. With this etchant, the etching speed in the (110) plane is about 80 times faster than the etching speed in the (111) plane so that narrow and deep grooves 60 can be easily cut. A p-type impurity is diffused from the inner walls of the grooves 60 to convert the conductivity types of the regions containing the grooves 60 to p-type. The diffusion is as deep as 1–3 μm and the surface concentration is preferably higher than $1 \times 10^{19}$ cm$^{-3}$ in order to make possible the ohmic contact of electrodes to be formed at the bottoms of the grooves 60. It is also preferable to employ a diffusion method in which no oxide film is formed during the diffusing process. Such a method can be realized by, for example, the ampoule diffusion of boron atoms in vacuum or in an atmosphere of argon. The surface coating film of the Si substrate is selectively removed again and an FCT as an embodiment of this invention is completed by forming an anode electrode 2, cathode electrodes 3 and gate electrodes 4 respectively on the exposed surfaces of the anode region 31 and the cathode regions 33 and on the first portions 341 of the gate regions, i.e. at the bottoms of the grooves 60. If the main surfaces have another plane such as (111), conventional etching solution can be used to make grooves 60.

Figure 7:
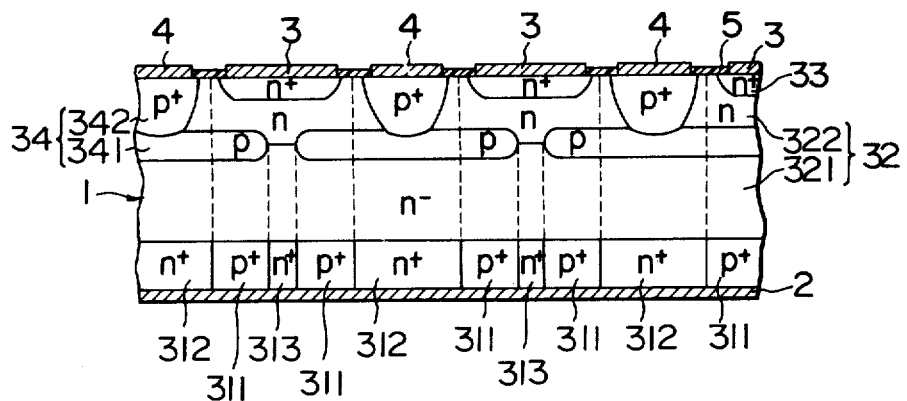

An FCT shown in FIG. 7 can be obtained by replacing a part of the p$^+$ anode region 31 by n$^+$ semiconductor regions 312 and/or n$^+$ semiconductor regions 313 with the remaining n$^+$ anode regions 311. The n$^+$ semiconductor regions 312 and/or the n$^+$ semiconductor regions 313 will have the following functions and effects. As described above, when the FCT is turned off through the gate control, the channels are first pinched off and then the residual carriers in the base region flow into the gate region due to diffusion or annihilate through recombination in the base region to establish a complete cut-off state. The time $t_d$ from the instant that the gate bias voltage is applied, to the instant that the channels are pinched off, is related to the time $t_f$ from the instant that the channels are pinched off, to the instant that the residual carriers annihilate in the base region to decrease the anode current to 10% of the value in the conducting state, by the inequality $t_d < < t_f$. For example, with a typical example of the FCT shown in FIG. 2, $t_d \simeq 2$ μsec. and $t_f \simeq 8$ μsec. The turn-off time is given as the sum of $t_d$ and $t_f$ and therefore $t_f$ has a considerable influence on the turn-off time. According to this invention, the turn-off time is shortened by conducting the electrons and the holes residual in the first portion of the base region in the turn-off period, to the anode electrode 2 respectively through the n+ regions 312 and 313 and the anode region 311. The flow of those carriers can be considered to be the reverse recovery current through a diode constituted of the p+ anode region 311 and the first region 321 of the n base region.

According to this invention, it is preferable to make the impurity concentrations in the n+ regions 312 and 313 as high as possible so as to shorten the turn-off time of the FCT. It is also preferable to locate the n+ regions in such a manner that at least a part of the projection of the second portion 342 of the gate region onto the anode electrode 2 overlaps tne n+ regions, so as to decrease the barriers in the current paths in the on-state. If the n+ region 313 is provided just below the channels, as shown in FIG. 7, then the turn-off time is shorter than in the case where the n+ region 313 is replaced by the p+ anode region and moreover the turn-on speed is accelerated since the density of current through the n+npn—p+ thyristor during the turn-on period is increased.

Figure 8A:
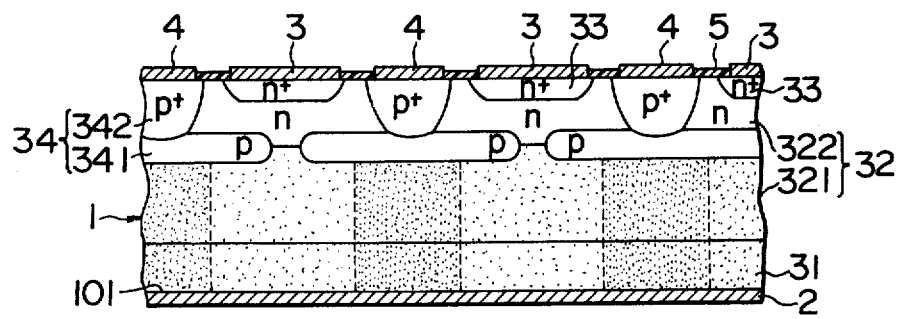

An FCT shown in FIG. 8A is characterized in that lifetime killer material is doped into at least a part of the FCT shown in FIG. 2. Atoms of heavy metal such as gold or platinum doped through diffusion and lattice defects caused by the irradiation with radioactive rays such as X-ray or γ-rays or electron beam. Electron beam is preferable since it has a high controllability and treatability. This embodiment of an FCT shown in FIG. 8A has an effect that the turn-off time is shortened while the forward voltage drop in the on-state is kept low. The domain in which the lifetime killer material is doped, should preferably contain at least the first portion 321 of the base region since the residual carriers having an influence on the turn-off time exist mainly in this region. It is more preferable to dope the lifetime killer material in such a manner that the lifetime of the minority carriers is shorter below the second portion 342 of the gate region than below the cathode region. In practice, the following method is employed. A uniform gold film is coated by vacuum evaporation on the entire main surface 101 as the exposed anode surface of a semiconductor substrate 1 which has been through a predetermined semiconductor fabrication process. Then, the gold film is selectively etched by the well-known photoetching technique in such a manner that the part of the gold film on the portion of the main surface 101 corresponding to the second portion 342 of the gate region is thicker than on the other portion of the main surface 101. Thereafter, the semiconductor substrate 1 is subjected to a heat treatment at high temperatures so as to diffuse the gold atoms. An FCT is completed by providing an anode electrode, a cathode electrode and a gate electrode.

Figure 8B:
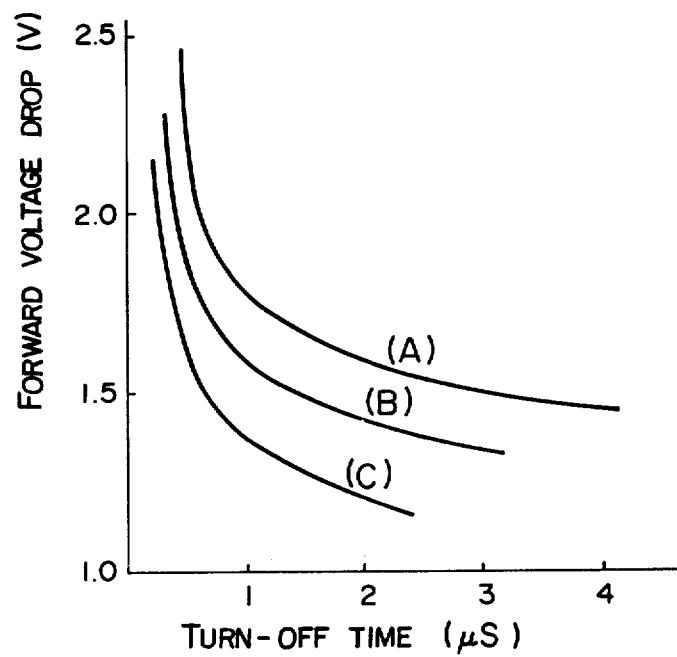

FIG. 8B shows the relationships between the turn-off times and the forward voltage drops of FCTs whose turn-off times were controlled by changing the quantities of gold atoms doped therein. In general, the greater is the quantity of the lifetime hiller material, the shorter is the turn-off time and the higher is the forward voltage drop. Accordingly, the graphs representing the above relationships resemble those of hyperbolae, as shown in FIG. 8B. The curve (A) corresponds to the case where the minority carriers in the first region 321 of the base region have a uniform lifetime, and the curve (B) represents the case where the lifetime $\tau_1$ of the minority carriers in the part of the first portion 321 below the second portion 342 of the gate region is set equal to ½ of the lifetime $\tau_2$ of the minority carriers in the other part of the first portion 321. The comparison of the case (A) with the case (B) shows that for the same forward voltage drop the turn-off time is shorter in the case (B) than in the case (A) and that for the same turn-off time the forward voltage drop is lower in the case (B) than in the case (A). This means that the case (B) is more preferable than the case (A). This conclusion is caused from the following reason. Namely, in the on-state, the second portion 342 of the gate region and the part of the base region below the second portion 342 provide no current path. Accordingly, no adverse affect is exerted on the forward voltage drop determined by $\tau_2$, no matter how short the lifetime $\tau_1$ of the minority carriers in the second portion 342 and the part therebelow is. On the other hand, when the FCT is turned off through the gate control, the residual carriers in the base region annihilate through diffusion into the gate region or recombination there, as described above. In this case, if $\tau_1$ is smaller than $\tau_2$, the residual carriers annihilate faster in the region where the lifetime equals $\tau_1$ than in the other region so that there occurs a difference between the concentrations of the residual carriers in both the regions. The difference causes the residual carriers to diffuse into the region where the lifetime equals $\tau_1$ and to annihilate rapidly in this region. This region where the lifetime equals $\tau_1$ therefore serves as a sinkhole for the residual carriers so that the turn-off time can be shortened.

The combined version of the FCT shown in FIG. 7 and the embodiment shown in FIG. 8A will be described. The curve (C) represents the characterstic of an FCT which is obtained by replacing only the part of the p+anode region 31 below the second portion 342 of the gate region in the FCT shown in FIG. 8A by an $n^{30}$ semiconductor region. It is seen from FIG. 8B that the case (C) excels the cases (A) and (B) in trade-off characteristic. In this case, the n+semiconductor region serves as a sinkhole for the residual carriers in addition to the region where the lifetime equals $\tau_1$.

Figure 9A:
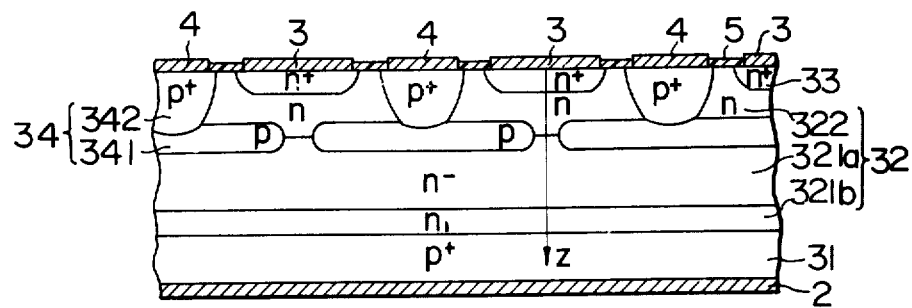
Figure 9B:
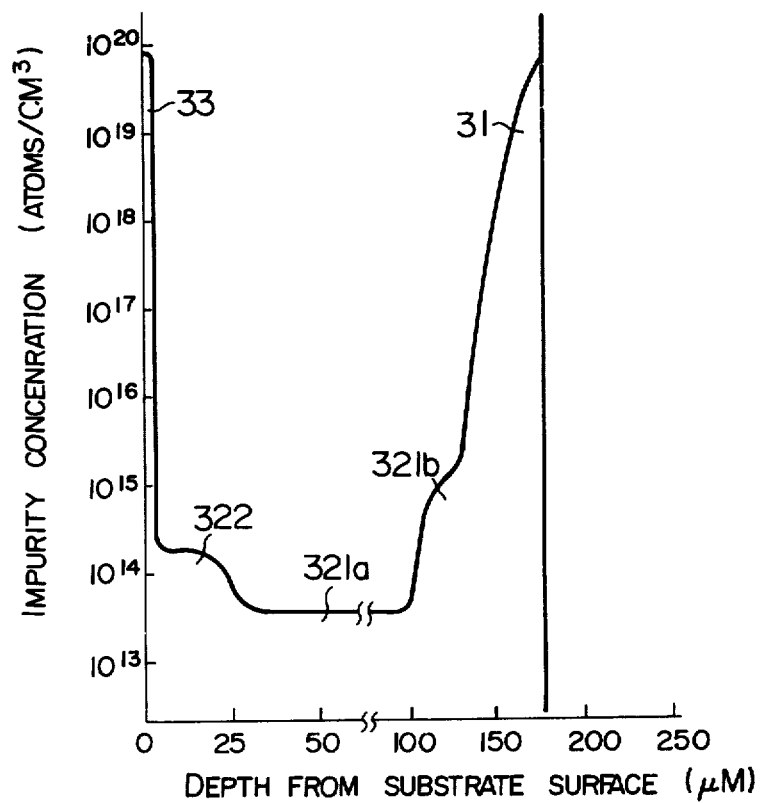

FIG. 9A shows an FCT characterized in that in the region corresponding to the first portion 321 of the base region of the FCT shown in FIG. 2A the impurity concentration is higher in the portion 321b nearer to the anode region 31 than in the portion 321a nearer to the second portion 341 of the gate region. FIG. 9B shows the profile of the impurity concentration along the direction indicated by Z in the FCT shown in FIG. 9A.

With this structure, even if the depletion layer expanding in the base region when the gate bias voltage is applied, is increased by decreasing the impurity concentration in the base region, there is no danger of punch-through taking place since the expansion of the depletion region toward the anode region is blocked by the portion 321b of the base region having a higher impurity concentration than the portion 321a of the base region. Consequently, the main current path of this FCT can be pinched off by a low gate voltage so that the blocking voltage gain can be increased. The provision of the portion 321b having a higher impurity concentration in the base region can make small the thickness of the base region which must otherwise be made large to prevent punch-through phenomena. Accordingly, the quantity of the residual carriers in the base region can be reduced by an amount corresponding to the reduced part of the thickness so that the turn-off time can be shortened.

Further, to make the feature of the FCT shown in FIG. 9A outstanding, the thickness of the portion 321a of the base region should be made as small as possible in view of keeping the forward voltage drop low. In practice, the thickness of the portion 321a is so set that the depletion region may expand until it reaches the portion 321b of the base region when the FCT is off-state.

As shown in FIG. 9B, the first portion of the base region has a thickness of about 70 μm, with the portions 321a and 321b having thicknesses of about 50 μm and 20 μm, respectively. For comparison, two other embodiments of this invention were prepared; one (I) obtained by removing the portion 321b from the first portion of the base region in the FCT shown in FIG. 9A and by setting the thickness of the portin 321a and the impurity concentration in the portion 321a at about 200 μm and $5 \times 10^{13}$ cm$^{-3}$, respectively, the other (II) obtained by removing the portion 321b and by setting the thickness and the impurity concentration at about 150 μm and $1 \times 10^{14}$ cm$^{-3}$. The comparative measurements of various characteristics of the FCTs are tabulated as follows.

TABLE

| CHARACTERISTICS | UNIT | DEVICE SHOWN IN FIG. 9A | DEVICES FOR COMPARISON | |
|---|---|---|---|---|
| | | | I | II |
| Blocking voltage (Rated value) | V | 1000 | 1000 | 1000 |
| Gate bias voltage | V | −10 | −10 | −20 |
| Forward voltage drop (at 100 A/cm$^2$) | V | 1.2 | 2.3 | 1.9 |
| Turn-off time | μs | 3 | 20 | 10 |

The forward voltage drop and the turn-off time of the device (I) for comparison is much greater than those of the device shown in FIG. 9A, though both the elements have the same gate bias voltage. The forward voltage drop and the turn-off time of the device (II) for comparison are improved to a certain extent as compared with the device (I) since the impurity concentration in the first portion 321 of the n$^-$ base region is made higher while the thickness thereof is made smaller. However, the device (II) is still inferior to the element shown in FIG. 9A, the gate bias voltage of the device (II) is twice as high as those of the device (I) and the device shown in FIG. 9A (the blocking voltage gain of the device (II) is half those of the device (I) and the device shown in FIG. 9A). These facts show that this embodiment has an excellent effect.

Figure 10:
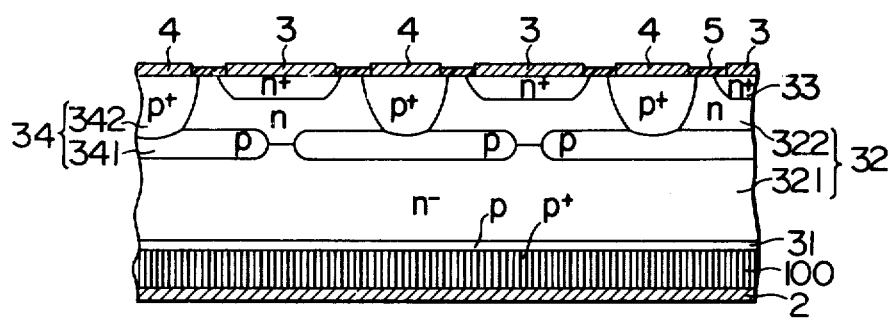

FIG. 10 shows an FCT as another embodiment of this invention characterized in that the thickness of the anode region 31 is reduced and that the quantity of the impurity doped into the anode region 31 to cause the region 31 to have a p-type conductivity is decreased. According to this embodiment, an FCT having a short turn-off time can be obtained without increasing the forward voltage drop, by decreasing the ratio of injecting holes from the anode region 31.

For example, if a p-type polycrystalline layer is deposited on an n-type single crystal substrate, the p-type impurity in the p-type polycrystalline layer is slightly diffused into the n-type substrate of single crystal to convert the portion of the n-type substrate adjoining the p-type polycrystalline layer to a thin p-type single crystal layer. Accordingly, a pn junction is formed between the p-type single crystal layer and the n-type single crystal substrate. The technique of limiting the quantity of carriers injected from the p-type single crystal layer by reducing the thickness of the p-type single crystal layer and by decreasing the quantity of the impurity in the p-type single crystal layer, is disclosed in, for example, the Japanese Patent Laid-Open Nos. 4179/77 and 90273/77. The present invention has been made on the basis of the application of the principle of the above technique to an FCT.

The anode region 31 of the FCT shown in FIG. 10 can be formed by, for example, the following process. A p-type polycrystalline silicon layer 100 is deposited on the exposed main surface of the first region 321 of the base region of a semiconductor substrate in which all the regions except anode region 31 are completed. An anode region 31 having a very small thickness is formed in the first portion 321 of the base region by using the p-type polycrystalline silicon layer as a diffusion source. If the thickness of the anode region 31 is about 0.05 μm-1 μm, a p emitter layer having a low ratio of hole injection can be obtained. The thin diffusion layer may be formed during the heat treatment for growing the polycrystalline layer or during the heat treatment performed again after the crystal growth. The polycrystalline silicon layer can be formed by heat treatment at 800–1000° C. in a hydrogen gas atmosphere, using trichlorsilane as raw material and diborane as dopant gas. Thickness of the polycrystalline layer should be large enough to prevent the anode-base junction from being injured in the step of forming the anode electrode. The thickness is preferably 30–60 μm.

It should be noted that some of the above described embodiments can be combined to obtain combined effects each of which is produced as a result of the organic combination of the embodiments and that such an FCT as obtained by synthesizing some of the embodiments also falls within the scope of this invention. In the above described embodiments, the functions and the effects are by no means degraded by interchanging the conductivity types n and p. Such an interchange of conductivity types does not depart from the spirit of this invention, either. Also, the gate region has only to consist of portions buried and juxtaposed in the base region and therefore the second portion 342, as seen in the above embodiments, extending from the first portion 341 to the gate electrode 4 may be omitted if desired. In that case, for example, the gate electrode 4 may be formed on the gate region exposed in the side surface connecting the pair of the main surfaces.

We claim:

1. A three terminal FCT (field controlled thyristor) comprising
  (a) a semiconductor substrate having a pair of opposite main surfaces and having a first conductivity type, said semiconductor substrate comprising
    (1) a first emitter region having said first conductivity type and exposed in one of said main surfaces of said substrate,
    (2) a second emitter region having a second conductivity type and exposed in the other main surface of said substrate, and
    (3) a gate region having said second conductivity type, with at least a portion of said gate region exposed in said one main surface, said gate region having a slab-like portion formed between said first and second emitter regions and a part of which overlaps the projection of said first emitter region onto said other main surface;

(4) a first base region having said first conductivity type and adjacent to said second emitter region, and (5) a second base region having said first conductivity type and a higher concentration of the impurity determining said first conductivity type and adjacent to said first emitter region;

(b) An electrode formed on said other surface of said substrate and electrodes connected respectively with the exposed portions of said first emitter region and said gate region, wherein the current path between the electrodes connected with said first and second emitter region includes a thyristor structure comprising said first emitter region, second base region, slab-like portion of said gate region, first base region and second emitter region, and said current is blocked by the depletion region formed in said substrate by the voltage applied between the electrodes connected respectively with said first emitter region and said gate region.

2. An FCT as claimed in claim 1, wherein the maximum impurity concentration in said slab-like portion is not more than $1 \times 10^{18}$ cm$^{-3}$.

3. An FCT as claimed in claim 1, wherein carrier lifetime killer is doped in said substrate.

4. An FCT as claimed in claim 3, wherein said lifetime killer is gold atoms or lattice defects caused by the irradiation of said substrate by radioactive rays.

5. An FCT as claimed in claim 3, wherein the concentration of said lifetime killer is lower in the portion of said substrate overlapping the projection of said first emitter region onto said other main surface of said substrate and higher in the other portion of said substrate.

6. An FCT as claimed in claim 1, wherein an electrode is formed on said second emitter region with a polycrystalline semiconductor layer having said second conductivity type interposed between said second emitter region and said electrode.

7. An FCT as claimed in claim 1, wherein said electrode to be connected with said gate region is formed at the bottoms of grooves cut in said one main surface, the bottom of each of said grooves reaching said slab-like portion of said gate region.

8. A three terminal FCT (field controlled thyristor) comprising (a) semiconductor substrate having a pair of opposite main surfaces, said substrate comprising
(1) a first emitter region having a first conductivity type and exposed in one of said main surfaces of said substrate,
(2) a second emitter region having a second conductivity type and exposed in other main surface of said substrate,
(3) a gate region having said second conductivity type, with a portion of said gate region exposed in said one main surface, said gate region having a slab-like portion formed between said first and second emitter regions and a part of which overlaps the projection of said first emitter region onto said other main surfaces,
(4) a first base region having said first conductivity type and adjacent to said second emitter region,
(5) a second base region having said first conductivity type and a lower concentration of the impurity determining said first conductivity type than that of said first base region and adjacent to said first base region, and
(6) a third base region having said first conductivity type and a higher concentration of the impurity determining said first conductivity type than that of said second base region and adjacent to said first emitter region;

(b) an electrode formed on said other surface of said substrate and electrodes connected respectively with the exposed portions of said first emitter region and said gate region, wherein the current path between the electrodes connected with said first and second emitter region includes a thyristor structure comprising said first emitter region second base region, slab-like portion of said gate region first base region and second emitter region, and said current is blocked by the depletion region formed in said substrate by the voltage applied between the electrodes connected respectively with said first emitter region and said gate region.

9. A three terminal FCT (field controlled thyristor) comprising (a) a semiconductor substrate having a pair of opposite main surfaces, said substrate comprising
(1) a first emitter region having a first conductivity type and exposed in one of said main surfaces of said substrate,
(2) a second emitter region having a second conductivity type and exposed in other main surface of said substrate,
(3) a gate region having said second conductivity type, with a portion of said gate region exposed in said one main surface, said gate region having a slab-like portion formed between said first and second emitter regions and a part of which overlaps the projection of said first emitter region onto said other main surfaces,
(4) a first base region having said first conductivity type and adjacent to said second emitter region, and
(5) a second base region having said first conductivity type and a higher concentration of the impurity determining said first conductivity type and adjacent to said first emitter region,
(6) a semiconductor region having said first conductivity type and exposed in part of said other main surface and adjacent to said second emitter region side by side, (b) an electrode formed on said other surface of said substrate and electrodes connected respectively with the exposed portions of said first emitter region and said gate region, wherein the current path between the electrodes connected with said first and second emitter region includes a thyristor structure comprising said first emitter region, second base region, slab-like portion of said gate region, first region and second emitter region, and said current is blocked by the depletion region formed in said substrate by the voltage applied between the electrodes connected respectively with said first emitter region and said gate region.

10. An FCT as claimed in claim 9, wherein said semiconductor region overlaps the projection of the exposed portion of said gate region onto said other main surface.

11. An FCT as claimed in claim 9, wherein said second emitter region overlaps the protection of both said first emitter region and said slab-like portion of said gate region.

* * * * *